(12) United States Patent
Soliz et al.

(10) Patent No.: US 7,485,202 B2
(45) Date of Patent: Feb. 3, 2009

(54) METHOD FOR MAKING A FLAT-TOP PAD

(75) Inventors: Debra Soliz, Midland, MI (US); Yeong Lee, Midland, MI (US)

(73) Assignee: Dow Corning Corporation, Midland, MI (US)

(*) Notice: Subject to any disclaimer, the term of this patent is extended or adjusted under 35 U.S.C. 154(b) by 366 days.

(21) Appl. No.: 10/571,435

(22) PCT Filed: Aug. 3, 2004

(86) PCT No.: PCT/US2004/025044

§ 371 (c)(1),
(2), (4) Date: Mar. 13, 2006

(87) PCT Pub. No.: WO2005/045903

PCT Pub. Date: May 19, 2005

(65) Prior Publication Data

US 2006/0254712 A1  Nov. 16, 2006

Related U.S. Application Data

(60) Provisional application No. 60/515,109, filed on Oct. 28, 2003.

(51) Int. Cl.
*B29C 65/00* (2006.01)
*B32B 37/00* (2006.01)
*B32B 38/04* (2006.01)
*B32B 38/14* (2006.01)
*C09J 5/02* (2006.01)
*H01L 21/00* (2006.01)
*H01L 21/31* (2006.01)

(52) U.S. Cl. .......... 156/277; 156/272.2; 156/272.6; 156/307.3; 438/118; 438/758

(58) Field of Classification Search .......... 156/272.2, 156/272.6, 277, 307.3; 438/118, 758
See application file for complete search history.

(56) References Cited

U.S. PATENT DOCUMENTS 2,676,182 A   4/1954   Daudt et al.

(Continued)

FOREIGN PATENT DOCUMENTS

EP   0 493 791 A1   12/1991

(Continued)

OTHER PUBLICATIONS

"Electronic Materials" Kirk-Othmer Encyclopedia of Chemical Technology, 4th ed., vol. 9, pp. 219-229, John Wiley & Sons, New York, 1994.

*Primary Examiner*—Philip C Tucker
*Assistant Examiner*—Michael N Orlando
(74) *Attorney, Agent, or Firm*—Catherine U. Brown (57) ABSTRACT

A method for preparing flat-top pads in electronic components includes the steps of: a) stencil printing a flat-top deposit of a curable silicone composition onto a first electronic substrate, where the first electronic substrate is selected from a semiconductor die or a semiconductor die attachment member, where stencil printing the flat-top deposit is performed by squeegee through a down-step stencil; b) curing the flat-top deposit to form a flat-top pad; optionally c) adhering a second electronic substrate to the top of the flat-top pad, where the second electronic substrate is selected from a semiconductor die or a semiconductor die attachment member; and optionally d) repeating steps a), b) and c).

11 Claims, 4 Drawing Sheets

U.S. PATENT DOCUMENTS

| | | |
|---|---|---|
| 3,159,601 A | 12/1964 | Ashby et al. |
| 3,220,972 A | 11/1965 | Lamoreaux |
| 3,296,291 A | 1/1967 | Chalk et al. |
| 3,419,593 A | 12/1968 | Willing |
| 3,445,420 A | 5/1969 | Kookootsedes et al. |
| 3,516,946 A | 6/1970 | Modic et al. |
| 3,814,730 A | 6/1974 | Karstedt |
| 3,989,667 A | 11/1976 | Lee et al. |
| 3,989,668 A | 11/1976 | Lee et al. |
| 4,273,902 A | 6/1981 | Tomioka et al. |
| 4,584,355 A | 4/1986 | Blizzard et al. |
| 4,584,361 A | 4/1986 | Janik et al. |
| 4,585,836 A | 4/1986 | Homan et al. |
| 4,591,622 A | 5/1986 | Blizzard et al. |
| 4,766,176 A | 8/1988 | Lee et al. |
| 4,784,879 A | 11/1988 | lee et al. |
| 5,017,654 A | 5/1991 | Togashi et al. |
| 5,036,117 A | 7/1991 | Chung et al. |
| 5,175,325 A | 12/1992 | Brown et al. |
| 5,248,715 A | 9/1993 | Gray et al. |
| 5,548,091 A * | 8/1996 | DiStefano et al. ............ 174/260 |
| 5,684,060 A | 11/1997 | Konings et al. |
| 6,034,441 A * | 3/2000 | Chen ........................... 257/787 |
| 6,089,151 A * | 7/2000 | Cobbley et al. .............. 101/127 |
| 6,212,767 B1 * | 4/2001 | Tandy ........................... 29/836 |
| 6,336,974 B1 * | 1/2002 | Ahmad ........................ 118/406 |
| 6,369,185 B1 * | 4/2002 | Amako et al. ................. 528/15 |
| 2003/0042617 A1 * | 3/2003 | Lee ............................. 257/778 |
| 2003/0145940 A1 | 8/2003 | Chaudhury et al. |

FOREIGN PATENT DOCUMENTS

| | | |
|---|---|---|
| EP | 0 347 895 B1 | 11/1993 |
| EP | 0 497 349 B1 | 6/1996 |
| EP | 0 850 997 A2 | 12/1997 |
| WO | WO 00/05652 | 2/2000 |

* cited by examiner

Figure 4a                                    Figure 4b

METHOD FOR MAKING A FLAT-TOP PAD

CROSS REFERENCE TO RELATED APPLICATIONS

This application is a U.S. national stage filing under 35 U.S.C. §371 of PCT Application No. PCT/US2004/02504 filed on 3 Aug. 2004, currently pending, which claims the benefit of U.S. Provisional Patent Application No. 60/515,109 filed 28 Oct. 2003 under 35 U.S.C. §119 (e). PCT Application No. PCT/US2004/02504 and U.S. Provisional Patent Application No. 60/515,109 are hereby incorporated by reference.

TECHNICAL FIELD

This invention relates to a method for making a flat-top pad that can be used in electronic applications. More particularly, this invention relates to a method for printing a flat-top pad that can be used as a die attach adhesive.

BACKGROUND

Printed pads on substrates such as silicon wafers and other substrates useful in electronic applications can be used as die attach adhesives. The pads can be used to bond a semiconductor die to a substrate, another die, or other electronic component. This application may be used for post-cure surface treatments of the pad material to generate or improve adhesion, for example where the pad is activated toward adhesion by a method such as plasma treatment or chemical deposition. However, these methods may suffer from the drawback that the top of the pad may not be flat. Imperfections, such as edgehills, may be present. If the top of the pad has imperfections, the imperfections can cause incomplete contact between the bonding surfaces and can result in poor adhesion. Therefore, there is a continuing need in the electronics industry for methods of providing flat-top pads.

PROBLEM TO BE SOLVED BY THE INVENTION

Without wishing to be bound by theory, it is thought that an edgehill forms during the formation of a pad on a substrate due to an interaction between a sidewall of an aperture in a deposition tool, such as a conventional screen or stencil used in printing processes, and a composition deposited on the substrate. This interaction causes the height of composition deposited near all or a portion of the sidewalls of the aperture to be higher than the height of composition deposited through the remainder of the aperature, thereby forming an edgehill around at least a portion of the perimeter of the resulting deposit. The edgehill may detrimentally affect adhesion of a flat substrate to the top of the pad formed by hardening the deposit.

SUMMARY

This invention relates to a method of reducing edgehills and making flat-top pads. The method of making flat-top pads comprises: a) applying a flat-top deposit of a composition onto a first substrate; and b) hardening the flat-top deposit. The method may further comprise c) adhering a second substrate to the top of the flat-top deposit; and optionally d) repeating steps a), b), and c).

DRAWINGS

FIG. 1b shows a top view of a portion of the stencil in FIG. 1a.

DETAILED DESCRIPTION OF THE INVENTION

All amounts, percentages, and ratios are by weight unless otherwise indicated. The following is a list of definitions as used herein.

Definitions

"Edgehill" means an area around at least a portion of the perimeter of a material that has a height greater than the remainder of the material.

"Plasma treatment" means exposing a surface to a gaseous state activated by a form of energy externally applied and includes, but is not limited to, corona discharge, dielectric barrier discharge, flame, plasma jet, low pressure glow discharge, and atmospheric glow discharge treatment. The gas used in plasma treatment may be air, ammonia, argon, carbon dioxide, carbon monoxide, helium, hydrogen, krypton, neon, nitrogen, nitrous oxide, oxygen, ozone, water vapor, combinations thereof, and others. Alternatively, other more reactive gases or vapors may be used, either in their normal state of gases at the process application pressure or vaporized with a suitable device from otherwise liquid states, such as hexamethyldisiloxane, cyclopolydimethylsiloxane, cyclopolyhydrogenmethylsiloxanes, cyclopolyhydrogenmethyl-co-dimethylsiloxanes, reactive silanes, and combinations thereof.

Method

This invention relates to a method of making flat-top pads. The method comprises:
 a) applying a flat-top deposit of a composition onto a first substrate;
 b) hardening the flat-top deposit;
 c) adhering a second substrate to the top of the flat-top deposit; and
 d) optionally repeating steps a), b), and c).

Figure 1A:
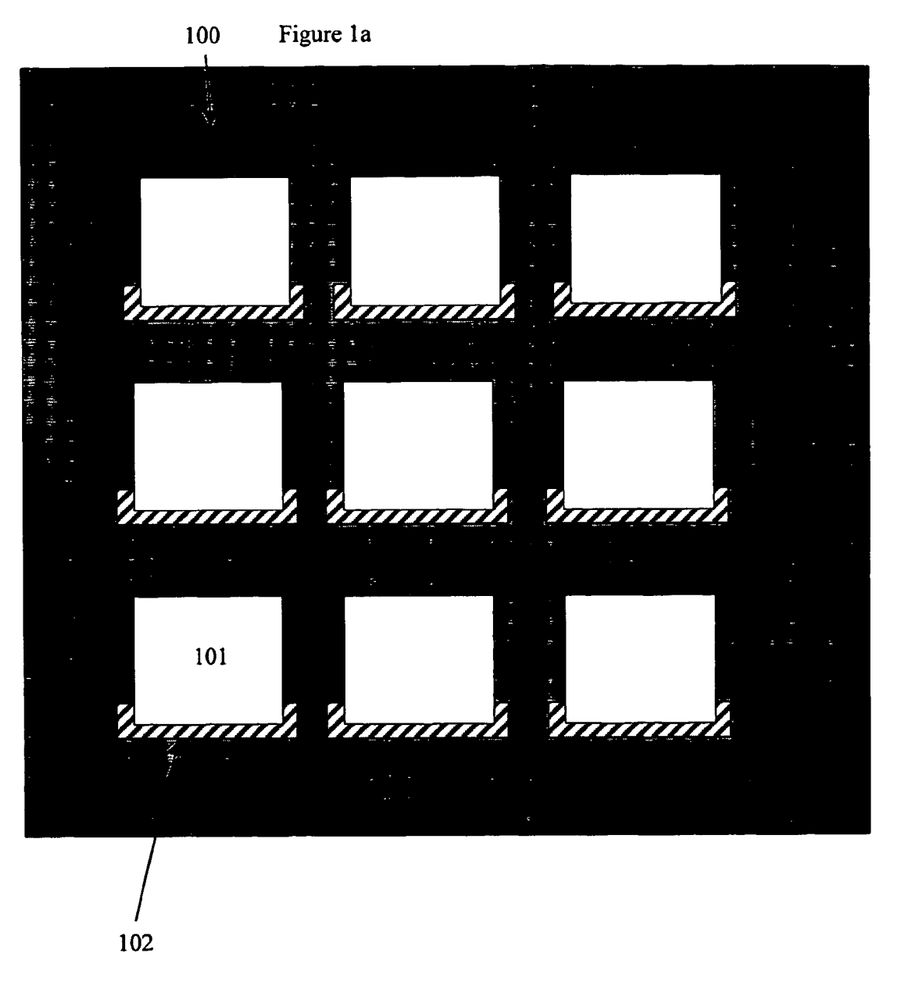
FIG. 1a shows a top view of a down-step stencil useful in the method of this invention.

The flat-top deposit may be applied to the substrate by forcing the composition through a deposition tool having at least one aperture surrounded by sidewalls. The heights of the sidewalls are reduced around at least a portion of the perimeter of the apertures on the deposition tool as compared to the average height of the deposition tool. For example, the flat-top deposit may be applied onto the first substrate by processes such as printing. Examples of suitable printing processes include stencil printing using a deposition tool exemplified by a down-step stencil and screen printing using a deposition tool exemplified by a screen having a plurality of apertures, each aperture being surrounded by sidewalls. The heights of the sidewalls are reduced around at least a portion of the perimeter of each aperture on the screen as compared to the average thickness of the screen. An example of a suitable down-step stencil is shown in FIGS. 1a, 1b, 1c, and 1d. FIG. 1a shows a top view of the down-step stencil 100 including a plurality of square apertures 101. Each aperture 101 has an etched area 102 around the trailing edge. The etched area 102 has a height 102z less than the height 100z of the remainder of the stencil 100. One skilled in the art would recognize that the exact stencil configuration selected depends on various factors including the composition selected to form the flat-top deposit and the size and shape of the flat-top deposit desired. The stencil may have aperatures with square corners as shown in FIG. 1a or apertures with rounded corners. The stencil may alternatively have an etched area surrounding the entire perimeter of each aperture. The stencil may optionally be electropolished. The substrates may be substrates useful in electronics applications such as polymers, metals, and semiconductors. Suitable examples of substrates are described below.

The flat-top deposit may be hardened by any convenient means, such as by cooling, for example when the composition is a hot-melt adhesive or by curing, for example when the composition is curable. The exact method for hardening depends on the type of composition selected. Suitable examples of compositions are described below.

Step c) may be performed before, during, or after step b), or combinations thereof. For example, when step c) is performed before step b), the second substrate is applied to wet composition. When step c) is performed during step b), the second substrate may be applied to B-staged (partially cured) composition. Step c) may be performed by a process comprising: i) activating the top of the flat-top pad, and ii) thereafter applying the second substrate to the top of the flat-top pad. Activating the top of the flat-top pad may be performed by known methods, such as plasma treatment. Examples of suitable plasma treatment processes are disclosed in U.S. patent application Ser. No. 09/973,498, filed on 9 Oct. 2001, having Publication No. 2003/0145940 which is hereby incorporated by reference for the purpose of disclosing plasma treatment processes.

The flat-top pad may be contacted with the second substrate as soon as practicable after plasma treatment. Alternatively, the method may optionally further comprise: storing the flat-top pad after step i) and before step ii). Plasma treatment can be performed on all or a portion of the surface of the flat-top pad or both the flat-top pad and the second substrate.

Adhesion can be obtained by performing step ii) for a few seconds at room temperature. Alternatively, step ii) may be carried out at elevated temperature, elevated pressure, or both. The exact conditions selected for step ii) will depend on various factors including the specific use of the method. Suitable methods for obtaining adhesion are disclosed, for example, in U.S. patent application Ser. No. 09/973,498, filed on 9 Oct. 2001, having Publication No. 2003/0145940, which is hereby incorporated by reference for the purpose of disclosing methods for creating adhesion.

The method of this invention can be used to prepare an electronic component. For example, an electronic component can be prepared by a method comprising:

a) stencil printing a flat-top deposit of a curable silicone composition onto a first electronic substrate, where the first electronic substrate is selected from a semiconductor die or a semiconductor die attachment member, where stencil printing the flat-top deposit is performed by squeegee through a down-step stencil;

b) curing the flat-top deposit to form a flat-top pad having a flat-top;

optionally c) adhering a second electronic substrate to the top of the flat-top deposit, where the second electronic substrate is selected from a semiconductor die or a semiconductor die attachment member;

optionally d) repeating steps a), b) and c). The curable silicone composition may cure to form, for example, a die attach adhesive.

Figure 2:
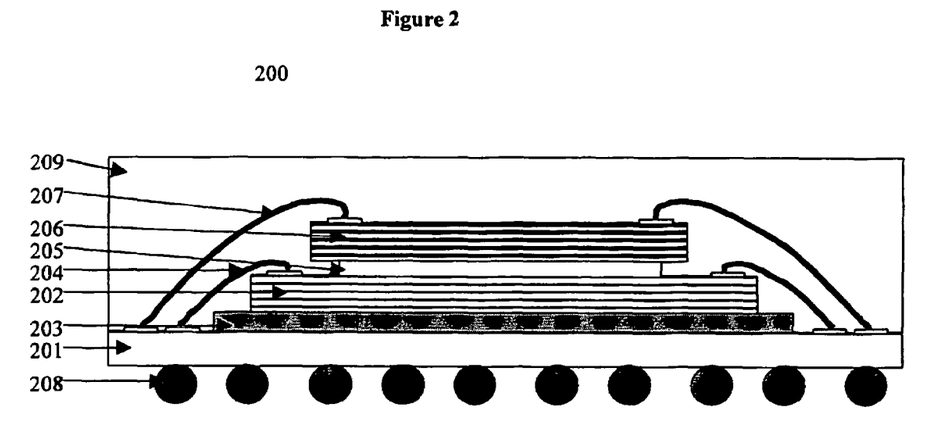
FIG. 2 shows a schematic representation of a stacked chip module that can be prepared by the method of this invention.

FIG. 2 shows an example of a stacked chip module 200 that may be prepared by the method of this invention. The stacked chip module 200 includes a substrate 201 having a first IC chip 202 bonded to the substrate 201 through a first die attach adhesive 203. The first IC chip 202 is electrically connected to the substrate 201 through wires 204. A second die attach adhesive 205 is formed on the first IC chip 202. A second IC chip 206 is attached to the second die attach adhesive 205. The second IC chip 206 is electrically connected to the substrate through wires 207. The substrate 201 has solder balls 208 on the surface opposite the first die attach adhesive 203.

The stacked chip module 200 may be prepared, for example, by applying a flat-top deposit of a first curable silicone composition to the substrate 201 through a down-step stencil according to the method of this invention, for example, the down-step stencil 100 shown in FIG. 1, and partially or fully curing the first curable silicone composition to form the first die attach adhesive 203 having a flat-top. The top of the first die attach adhesive 203 may then be plasma treated to activate the surface and the first IC chip 202 may be applied to the activated surface with pressure. The first die attach adhesive 203 may optionally be heated during or after application of the first IC chip 202, or both, for example, to further cure the first die attach adhesive 203.

A flat-top deposit of a second curable liquid composition (that may be the same as or different than the first curable liquid composition) may then be applied to the top of the first IC chip 202 again using a down-step stencil according to the method of this invention, for example, the down-step stencil 100 shown in FIG. 1. The second curable liquid composition may be partially or fully cured to form the second die attach adhesive 205 having a flat-top. The top of the second die attach adhesive 205 may then be plasma treated to activate the surface, and the second IC chip 206 may be applied to the activated surface with pressure. The second die attach adhesive 205 may optionally be heated during or after application of the first IC chip 202, or both, for example, to further cure the second die attach adhesive 206.

Wire bonding may then be performed to electrically connect the first IC chip 202 to the substrate 201 through wires 204 and to electrically connect the second IC chip 206 to the substrate 201 through wires 207. Solder balls 208 may be attached to the substrate 201 on the surface opposite the first die attach adhesive 203. An overmolding 209 may be added to protect the IC chips 202, 206 and the wires 204, 207.

Compositions

Compositions suitable for use in the method described above may be any convenient hot melt adhesive or curable composition. Suitable curable compositions include curable silicone compositions, curable silicone-organic compositions, and curable organic compositions. Curable silicone compositions may be curable by, for example, hydrosilylation reaction or condensation reaction. Suitable curable silicone-organic compositions include silicone-phenol compositions and silicone-epoxy compositions. Suitable curable organic compositions are exemplified by epoxy compositions. Suitable curable compositions may be curable by, for example, exposure to heat, moisture, ultra-violet radiation, microwave radiation, electron beam radiation, oxygen, or combinations thereof. Suitable compositions for use in the method described above may be die attach adhesive compositions. The die attach adhesive composition may comprise a curable silicone composition that cures to form a silicone die attach adhesive, a curable silicone-organic composition that cures to form a silicone-organic die attach adhesive, or a curable organic composition that cures to form an organic die attach adhesive. Suitable curable silicone compositions, include, but are not limited to, the die attach adhesive compositions in U.S. patent application Ser. No. 09/973,498, filed on 9 Oct. 2001, having Publication No. 2003/0145940, and other hydrosilylation curable silicone compositions comprising: A) a polyorganosiloxane containing an average of at least two aliphatically unsaturated organic groups per molecule, B) a polyorganohydrogensiloxane containing an average of at least two silicon bonded hydrogen atoms per molecule, and C) a hydrosilylation reaction catalyst. The composition may further comprise one or more optional components suitable for use in die attach adhesives, such as D) an cure modifier, E) a filler, F) a treating agent for the filler, G) a spacer, H) an adhesion promoter, I) a pigment, J) a rheology modifier, K) a void reducing agent, and L) a solvent.

Component (A) Polyorganosiloxane

Component (A) is a polyorganosiloxane having an average of at least two unsaturated organic groups per molecule. Component (A) may have a linear, branched, or resinous structure. Component (A) may be a homopolymer or a copolymer. The unsaturated organic groups may be alkenyl groups having from 2 to 12 carbon atoms and are exemplified by, but not limited to, vinyl, allyl, butenyl, and hexenyl. The unsaturated organic groups may be alkynyl groups having 2 to 12 carbon atoms, and are exemplified by, but not limited to, ethynyl, propynyl, and butynyl. Alternatively, the unsaturated organic groups may contain acrylate-functional or methacrylate-functional groups and are exemplified by, but not limited to, acryloyloxyalkyl such as acryloyloxypropyl and methacryloyloxyalkyl such as methacryloyloxypropyl. The unsaturated organic groups in component (A) may be located at terminal, pendant, or both terminal and pendant positions.

The remaining silicon-bonded organic groups in component (A) may be monovalent organic groups free of aliphatic unsaturation. These monovalent organic groups may have 1 to 20 carbon atoms, alternatively 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and cyano-functional groups such as cyanoalkyl groups exemplified by cyanoethyl and cyanopropyl. Component (A) is free of fluorine atoms.

The viscosity of component (A) is not specifically restricted, however, component (A) may have a viscosity of 0.05 to 500 Pa·s at 25° C., alternatively 0.1 to 200 Pa·s at 25° C. Component (A) is added to the composition in an amount of 100 weight parts.

Component (A) may comprise a polyorganosiloxane of the formula
(a) $R^1_3SiO(R^1_2SiO)_\alpha(R^1R^2SiO)_\beta SiR^1_3$,
(b) $R^3_2R^4SiO(R^3_2SiO)_\chi(R^3R^4SiO)_\delta SiR^3_2R^4$, or
(c) a combination thereof.

In formula (a), $\alpha$ has an average value of 0 to 2000, and $\beta$ has an average value of 2 to 2000. Each $R^1$ is independently a monovalent organic group. Suitable monovalent organic groups include, but are not limited to, acrylic functional groups such as acryloyloxypropyl and methacryloyloxypropyl; alkyl groups such as methyl, ethyl, propyl, and butyl; alkenyl groups such as vinyl, allyl, and butenyl; alkynyl groups such as ethynyl and propynyl; aromatic groups such as phenyl, tolyl, and xylyl; and cyanoalkyl groups such as cyanoethyl and cyanopropyl. Each $R^2$ is independently an unsaturated monovalent organic group. $R^2$ is exemplified by alkenyl groups such as vinyl, allyl, and butenyl and alkynyl groups such as ethynyl and propynyl, and acrylic functional groups such as acryloyloxypropyl and methacryloyloxypropyl.

In formula (b), $\chi$ has an average value of 0 to 2000, and $\delta$ has an average value of 0 to 2000. Each $R^3$ is independently a monovalent organic group. Suitable monovalent organic groups include, but are not limited to, acrylic functional groups such as acryloyloxypropyl and methacryloyloxypropyl; alkyl groups such as methyl, ethyl, propyl, and butyl; alkenyl groups such as vinyl, allyl, and butenyl; alkynyl groups such as ethynyl and propynyl; aromatic groups such as phenyl, tolyl, and xylyl; and cyanoalkyl groups such as cyanoethyl and cyanopropyl. Each $R^4$ is independently an unsaturated organic hydrocarbon group. $R^4$ is exemplified by alkenyl groups such as vinyl, allyl, and butenyl; alkynyl groups such as ethynyl and propynyl; and acrylic functional groups such as acryloyloxypropyl and methacryloyloxypropyl.

Component (A) may comprise polydiorganosiloxanes such as
i) dimethylvinylsiloxy-terminated polydimethylsiloxane,
ii) dimethylvinylsiloxy-terminated poly(dimethylsiloxane/methylvinylsiloxane),
iii) dimethylvinylsiloxy-terminated polymethylvinylsiloxane,
iv) trimethylsiloxy-terminated poly(dimethylsiloxane/methylvinylsiloxane),
v) trimethylsiloxy-terminated polymethylvinylsiloxane,
vi) dimethylvinylsiloxy-terminated poly(dimethylsiloxane/methylphenylsiloxane),
vii) dimethylvinylsiloxy-terminated poly(dimethylsiloxane/diphenylsiloxane),
viii) phenyl,methyl,vinyl-siloxy-terminated polydimethylsiloxane,
ix) dimethyl-acryloyloxypropyl-siloxy-terminated polydimethylsiloxane,
x) dimethyl-methacryloyloxypropyl-siloxy-terminated polydimethylsiloxane,
xi) dimethylhexenylsiloxy-terminated polydimethylsiloxane,
xii) dimethylhexenylsiloxy-terminated poly(dimethylsiloxane/methylhexenylsiloxane),
xiii) dimethylhexenylsiloxy-terminated polymethylhexenylsiloxane,
xiv) trimethylsiloxy-terminated poly(dimethylsiloxane/methylhexenylsiloxane),
xv) dimethylvinylsiloxy-terminated poly(dimethylsiloxane/methylcyanopropylsiloxane), and
xvi) combinations thereof.

Methods of preparing polydiorganosiloxanes suitable for use as component (A), such as hydrolysis and condensation of the corresponding organohalosilanes or equilibration of cyclic polydiorganosiloxanes, are well known in the art.

Component (A) may comprise resins such as an MQ resin consisting essentially of $R^5_3SiO_{1/2}$ units and $SiO_{4/2}$ units, a TD resin consisting essentially of $R^5SiO_{3/2}$ units and $R^5_2SiO_{2/2}$ units, an MT resin consisting essentially of $R^5_3SiO_{1/2}$ units and $R^5SiO_{3/2}$ units, an MTD resin consisting essentially of $R^5_3SiO_{1/2}$ units, $R^5SiO_{3/2}$ units, and $R^5_2SiO_{2/2}$ units, or a combination thereof.

Each $R^5$ is a monovalent organic group. The monovalent organic groups represented by $R^5$ may have 1 to 20 carbon atoms, alternatively 1 to 10 carbon atoms. Examples of monovalent organic groups include, but are not limited to, acrylate functional groups such as acryloxyalkyl groups, methacrylate functional groups such as methacryloxyalkyl groups, cyano-functional groups, and monovalent hydrocarbon groups. Monovalent hydrocarbon groups include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl. Cyano-functional groups include, but are not limited to cyanoalkyl groups such as cyanoethyl and cyanopropyl.

The resin may contain an average of 3 to 30 mole percent of unsaturated organic groups. The unsaturated organic groups may be alkenyl groups, alkynyl groups, acrylate-functional groups, methacrylate-functional groups, or combinations thereof. The mole percent of unsaturated organic groups in the resin is the ratio of the number of moles of unsaturated group-containing siloxane units in the resin to the total number of moles of siloxane units in the resin, multiplied by 100.

Methods of preparing resins are well known in the art. For example, resin may be prepared by treating a resin copolymer produced by the silica hydrosol capping process of Daudt et al. with at least an alkenyl-containing endblocking reagent. The method of Daudt et al., is disclosed in U.S. Pat. No. 2,676,182.

Briefly stated, the method of Daudt et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally contain from 2 to 5 percent by weight of hydroxyl groups.

The resin, which typically contains less than 2 percent by weight of silicon-bonded hydroxyl groups, may be prepared by reacting the product of Daudt et al. with an unsaturated organic group-containing endblocking agent and an endblocking agent free of aliphatic unsaturation, in an amount sufficient to provide from 3 to 30 mole percent of unsaturated organic groups in the final product. Examples of endblocking agents include, but are not limited to, silazanes, siloxanes, and silanes. Suitable endblocking agents are known in the art and exemplified in U.S. Pat. Nos. 4,584,355; 4,591,622; and 4,585,836. A single endblocking agent or a mixture of such agents may be used to prepare the resin.

Component (A) can be a single polyorganosiloxane or a combination comprising two or more polyorganosiloxanes that differ in at least one of the following properties: structure, viscosity, average molecular weight, siloxane units, and sequence.

Component (B) Organohydrogenpolysiloxane

Component (B) is an organohydrogenpolysiloxane having an average of at least two silicon-bonded hydrogen atoms per molecule. Component (B) can be can be a homopolymer or a copolymer. Component (B) can have a linear, branched, cyclic, or resinous structure. The silicon-bonded hydrogen atoms in the component (B) can be located at terminal, pendant, or at both terminal and pendant positions. Component (B) is free of fluorine atoms.

Component (B) can comprise siloxane units including, but not limited to, $HR^6_2SiO_{1/2}$, $R^6_3SiO_{1/2}$, $HR^6SiO_{2/2}$, $R^6_2SiO_{2/2}$, $R^6SiO_{3/2}$, and $SiO_{4/2}$ units. In the preceding formulae, each $R^6$ is independently selected from monovalent organic groups free of aliphatic unsaturation.

Component (B) may comprise a compound of the formula
(a) $R^7_3SiO(R^7_2SiO)_\epsilon(R^7HSiO)_\phi SiR^7_3$, or
(b) $R^8_2HSiO(R^8_2SiO)_\gamma(R^8HSiO)_\eta SiR^8_2H$,
(c) a combination thereof.

In formula (a), $\epsilon$ has an average value of 0 to 2000, and $\phi$ has an average value of 2 to 2000. Each $R^7$ is independently a monovalent organic group free of aliphatic unsaturation. Suitable monovalent organic groups free of aliphatic unsaturation include alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl.

In formula (b), $\gamma$ has an average value of 0 to 2000, and $\eta$ has an average value of 0 to 2000. Each $R^8$ is independently a monovalent organic group free of aliphatic unsaturation. Suitable monovalent organic groups free of aliphatic unsaturation include alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl.

Component (B) is exemplified by
i) dimethylhydrogensiloxy-terminated polydimethylsiloxane,
ii) dimethylhydrogensiloxy-terminated poly(dimethylsiloxane/methylhydrogensiloxane),
iii) dimethylhydrogensiloxy-terminated polymethylhydrogensiloxane,
iv) trimethylsiloxy-terminated poly(dimethylsiloxane/methylhydrogensiloxane),
v) trimethylsiloxy-terminated polymethylhydrogensiloxane,
vi) a resin consisting essentially of $H(CH_3)_2SiO_{1/2}$ units and $SiO_{4/2}$ units, and
vii) combinations thereof.

Component (B) can be a combination of two or more organohydrogenpolysiloxanes that differ in at least one of the following properties: structure, average molecular weight, viscosity, siloxane units, and sequence.

Methods of preparing linear, branched, and cyclic organohydrogenpolysiloxanes suitable for use as component (B), such as hydrolysis and condensation of organohalosilanes, are well known in the art. Methods of preparing organohydrogenpolysiloxane resins suitable for use as component (B) are also well known as exemplified in U.S. Pat. Nos. 5,310,843; 4,370,358; and 4,707,531.

The molar ratio of silicon-bonded hydrogen atoms in component (B) to aliphatically unsaturated groups in component (A) ($SiH_B/Vi_A$) is not critical.

Component (C) Hydrosilylation Catalyst

Component (C) is a hydrosilylation catalyst. Component (C) is added to the composition in an amount of 0.1 to 1000 ppm of platinum group metal, alternatively 1 to 500 ppm, alternatively 2 to 200, alternatively 5 to 150 ppm, based on the weight of the composition. Suitable hydrosilylation catalysts are known in the art and commercially available. Component (C) may comprise a platinum group metal selected from platinum, rhodium, ruthenium, palladium, osmium or iridium metal or organometallic compound thereof, or a combination thereof. Component (C) is exemplified by compounds such as chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix.

Suitable hydrosilylation catalysts for component (C) are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are known in the art, as exemplified in U.S. Pat. No. 4,766,176 and the references cited therein; and U.S. Pat. No. 5,017,654.

Component (D) Cure Modifier

Component (D) is an cure modifier. Component (D) can be added to extend the shelf life or working time, or both, of the composition of this invention. Component (D) can be added to raise the curing temperature of the composition. Suitable cure modifiers are known in the art and are commercially available. Component (D) is exemplified by acetylenic alcohols such as methyl butynol, ethynyl cyclohexanol, dimethyl hexynol, and combinations thereof; cycloalkenylsiloxanes such as methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and combinations thereof; ene-yne compounds such as 3-methyl-3-penten-1-yne, 3,5-dimethyl-3-hexen-1-yne; triazoles such as benzotriazole; phosphines; mercaptans; hydrazines; amines such as tetramethyl ethylenediamine, dialkyl fumarates, dialkenyl fumarates, dialkoxyalkyl fumarates, maleates, and combinations thereof. Suitable cure modifiers are disclosed by, for example, U.S. Pat. Nos. 3,445,420; 3,989,667; 4,584,361; and 5,036,117.

The amount of component (D) that may be added to the composition will depend on the particular cure modifier used, the nature and amount of component (C), and the composition of component (B). However, the amount of component (D) may be 0.001% to 10% based on the weight of the composition.

Component (E) Filler

Component (E) is a filler. The amount of component (E) that may added to the composition depends on various factors including the Theological properties desired and the type of filler selected. Component (E) may be added to the composition in an amount of 0.1% to 90% based on the weight of the compositions. Suitable fillers include reinforcing fillers such silica, titania, and combinations thereof. Suitable reinforcing fillers are known in the art and commercially available, such as a ground silica sold under the name MIN-U-SIL by U.S. Silica of Berkeley Springs, W. Va. or fumed silica sold under the name CAB-O-SIL by Cabot Corporation of Massachusetts.

Conductive fillers (i.e., fillers that are thermally conductive, electrically conductive, or both) may also be used as component (E). Suitable conductive fillers include metal particles, metal oxide particles, and a combination thereof. Suitable thermally conductive fillers are exemplified by aluminum nitride; aluminum oxide; barium titanate; beryllium oxide; boron nitride; diamond; graphite; magnesium oxide; metal particulate such as copper, gold, nickel, or silver; silicon carbide; tungsten carbide; zinc oxide, and a combination thereof.

Conductive fillers are known in the art and commercially available, see for example, U.S. Pat. No. 6,169,142 (col. 4, lines 7-33). For example, CB-A20S and A1-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the conductive filler particles is not specifically restricted, however, rounded or spherical particles may prevent viscosity increase to an undesirable level upon high loading of the thermally conductive filler in the composition.

A combination of fillers having differing particle sizes and different particle size distributions may be used. For example, it may be desirable to combine a first filler having a larger average particle size with a second filler having a smaller average particle size in a proportion meeting the closest packing theory distribution curve. This may improve packing efficiency and may reduce viscosity and enhance heat transfer.

Component (F) Treating Agent

The filler may optionally be surface treated with a treating agent. Treating agents and treating methods are known in the art, see for example, U.S. Pat. No. 6,169,142 (col. 4, line 42 to col. 5, line 2). The filler may be treated with the treating agent prior to combining the filler with the other components of the composition, or the filler may be treated in situ.

The treating agent can be an alkoxysilane having the formula: $R^9_p Si(OR^{10})_{(4-p)}$, where p is 1, 2, or 3; alternatively p is 3. $R^9$ is a substituted or unsubstituted monovalent hydrocarbon group of at least 1 carbon atom, alternatively at least 8 carbon atoms. $R^9$ has up to 50 carbon atoms, alternatively up to 30 carbon atoms, alternatively up to 18 carbon atoms. $R^9$ is exemplified by alkyl groups such as hexyl, octyl, dodecyl, tetradecyl, hexadecyl, and octadecyl; and aromatic groups such as benzyl, phenyl and phenylethyl. $R^9$ can be saturated or unsaturated, branched or unbranched, and unsubstituted. $R^9$ can be saturated, unbranched, and unsubstituted.

$R^{10}$ is an unsubstituted, saturated hydrocarbon group of at least 1 carbon atom. $R^{10}$ may have up to 4 carbon atoms, alternatively up to 2 carbon atoms. The treating agent is exemplified by hexyltrimethoxysilane, octyltriethoxysilane, decyltrimethoxysilane, dodecyltrimethyoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^{11}O)_d Si(OSiR^{12}_2 R^{13})_{4-d}$. In this formula, d is 1, 2, or 3, alternatively d is 3. Each $R^{11}$ can be an alkyl group. Each $R^{12}$ can be independently selected from saturated and unsaturated monovalent hydrocarbon groups of 1 to 10 carbon atoms. Each $R^{13}$ can be a saturated or unsaturated monovalent hydrocarbon group having at least 11 carbon atoms.

Metal fillers can be treated with alkylthiols such as octadecyl mercaptan and others, and fatty acids such as oleic acid, stearic acid, titanates, titanate coupling agents, zirconate coupling agents, and a combination thereof.

Treatment agents for alumina or passivated aluminum nitride could include alkoxysilyl functional alkylmethyl polysiloxanes (e.g., partial hydrolysis condensate of $R^{14}_b R^{15}_c Si(OR^{16})_{(4-b-c)}$ or cohydrolysis condensates or mixtures), similar materials where the hydrolyzable group would be silazane, acyloxy or oximo. In all of these, a group tethered to Si, such as $R^{14}$ in the formula above, is a long chain unsaturated monovalent hydrocarbon or monovalent aromatic-functional hydrocarbon. $R^{15}$ is a monovalent hydrocarbon group, and $R^{16}$ is a monovalent hydrocarbon group of 1 to 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Component (G) Spacer

Component (G) is a spacer. Spacers can comprise organic particles, inorganic particles, or a combination thereof. Spacers can be thermally conductive, electrically conductive, or both. Spacers can have a particle size of 25 micrometers to 250 micrometers. Spacers can comprise monodisperse beads. The amount of component (G) depends on various factors including the distribution of particles, pressure to be applied during placement of the composition, temperature of placement, and others. The composition can contain up to 15%, alternatively up to 5% of component (G) added in addition to, or instead of, a portion of component (E).

Component (H) Adhesion Promoter

Component (H) is an adhesion promoter. Component (H) may be added to the composition in an amount of 0.01 to 50 weight parts based on the weight of the composition. Component (H) may comprise a transition metal chelate, an alkoxysilane, a combination of an alkoxysilane and a hydroxy-functional polyorganosiloxane, or a combination thereof.

Component (H) can be an unsaturated or epoxy-functional compound. Suitable epoxy-functional compounds are known in the art and commercially available, see for example, U.S. Pat. Nos. 4,087,585; 5,194,649; 5,248,715; and 5,744,507 col. 4-5. Component (H) may comprise an unsaturated or epoxy-functional alkoxysilane. For example, the functional alkoxysilane can have the formula $R^{17}_\mu Si(OR^{18})_{(4-\mu)}$, where $\mu$ is 1, 2, or 3, alternatively $\mu$ is 1.

Each $R^{17}$ is independently a monovalent organic group with the proviso that at least one $R^{17}$ is an unsaturated organic group or an epoxy-functional organic group. Epoxy-functional organic groups for $R^{17}$ are exemplified by 3-glycidoxypropyl and (epoxycyclohexyl)ethyl. Unsaturated organic groups for $R^{17}$ are exemplified by 3-methacryloyloxypropyl, 3-acryloyloxypropyl, and unsaturated monovalent hydrocarbon groups such as vinyl, allyl, hexenyl, undecylenyl.

Each $R^{18}$ is independently an unsubstituted, saturated hydrocarbon group of at least 1 carbon atom. $R^{18}$ may have up to 4 carbon atoms, alternatively up to 2 carbon atoms. $R^{18}$ is exemplified by methyl, ethyl, propyl, and butyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

Component (H) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. Component (H) may comprise a combination of an epoxy-functional alkoxysilane and an epoxy-functional siloxane. For example, component (H) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methyvinyl/dimethylsiloxane copolymer. When used as a physical blend rather than as a reaction product, these components may be stored separately in multiple-part kits.

Suitable transition metal chelates include titanates, zirconates such as zirconium acetylacetonate, aluminum chelates such as aluminum acetylacetonate, and combinations thereof. Transition metal chelates and methods for their preparation are known in the art, see for example, U.S. Pat. No. 5,248,715, EP 0 493 791 A1, and EP 0 497 349 B1.

Component (I) Pigment

Component (I) is a pigment. The amount of component (I) added to the composition depends on the type of pigment selected. Component (I) may be added to the composition in an amount of 0.001% to 30% based on the weight of the composition. Pigments are known in the art and commercially available. Suitable pigments include carbon blacks, such as LB-1011C carbon black from Williams, chromium oxide pigments, such as Harcros G-6099, titanium dioxides such as those available from DuPont, and UV-active dyes such as (thiophenediyl)bis(t-butylbenzoxazole) which is commercially available under the name UVITEX OB from Ciba Specialty Chemicals.

Component (J) Rheology Modifier

Component (J) is a rheology modifier. Rheology modifiers can be added to change the thixotropic properties of the composition. Component (J) is exemplified by flow control additives; reactive diluents; anti-settling agents; alpha-olefins; hydroxyl-terminated silicone-organic copolymers, including but not limited to hydroxyl-terminated polypropyleneoxide-dimethylsiloxane copolymers; and combinations thereof.

Component (K) Void Reducing Agent

Component (K) is a void reducing agent. Component (K) can be added to the composition in an amount sufficient to reduce voids. Suitable void reducing agents are known in the art and commercially available, see for example, EP 0 850 997 A2 and U.S. Pat. Nos. 4,273,902 and 5,684,060. Suitable void reducing agents can comprise zeolites, anhydrous aluminum sulfate, molecular sieves (e.g., with a pore diameter of 10 Å or less), kieselguhr, silica gel, activated carbon, palladium compounds such as palladium metal, palladium metal supported on a substrate exemplified by carbon or alumina, and organopalladium compounds.

Component (L) Solvent

Component (L) is a solvent that may be added to the composition. Component (L) may be an organic solvent such as an alkane, alcohol, aromatic solvent, ketone, or combinations thereof.

Substrates

Suitable substrates to which the composition may be applied, and which are useful in electronics applications, include but are not limited to polymers, such as epoxies, polycarbonates, poly(butylene terephthalate) resins, polyamide resins and blends thereof, such as blends of polyamide resins with syndiotactic polystyrene such as those commercially available from the Dow Chemical Company, of Midland, Mich., U.S.A., acrylonitrile-butadiene-styrenes, styrene-modified poly(phenylene oxides), poly(phenylene sulfides), vinyl esters, polyphthalamides, polyimides, and combinations thereof; metals such as aluminum, stainless steel alloys, titanium, copper, nickel, silver, gold, and combinations thereof; and semiconductors. Suitable substrates may be lead frames or patterned substrates. Semiconductors are known in the art and commercially available, for example, see J. Kroschwitz, ed., "Electronic Materials," *Kirk-Othmer Encyclopedia of Chemical Technology*, $4^{th}$ ed., vol. 9, pp. 219-229, John Wiley & Sons, New York, 1994. Common semiconductors include silicon, silicon alloys such as silicon carbide and silicon nitride, gallium arsenide, gallium nitride. The semiconductor can have any convenient form, such as a bare die, a chip such as an IC chip or LED chip, or a wafer.

EXAMPLES

These examples are intended to illustrate the invention to one of ordinary skill in the art and should not be interpreted as limiting the scope of the invention set forth in the claims.

Example 1

A curable silicone composition containing vinyl functional silicone polymer, SiH functional silicone polymer, Pt catalyst, an cure modifier, 5% of fumed silica, and an adhesion promoter, is applied by printing to a silicon wafer to ca 100 micrometer (μm) thickness. Printing is performed through a down-step stencil 100 illustrated in FIGS. 1a,1b, 1c, and 1d. The down-step stencil 100 has a final thickness (to 1 mil) at the trailing edge, which is chemically etched from 5 mil thick stencil.

FIGS. 1a, 1b, 1c, and 1d illustrate the down-step stencil 100 used in Example 1. FIG. 1a shows a top view of the stencil 100 including a plurality of square apertures 101. Each aperture 101 has an etched area 102 around the trailing edge. Printing is performed in Example 1 by using a squeegee to push the curable silicone composition in a direction from the leading edge (top) toward the trailing edge (bottom) of the stencil 100 in FIG. 1a.

Figure 1B:
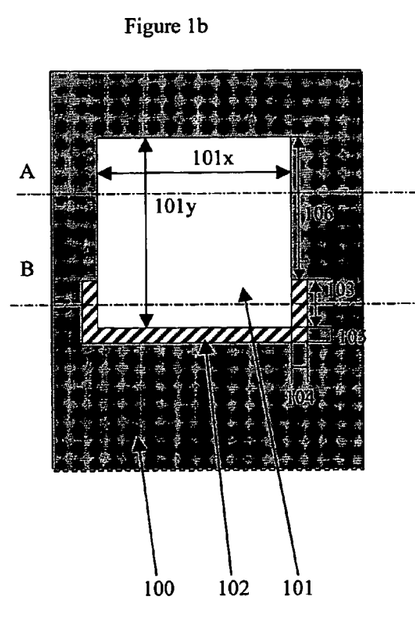

FIG. 1b shows a top view of a portion of the stencil 100 in FIG. 1a, including one aperture 101 and one etched area 102. Aperture 101 has a length 101y of 6 mm and a width 101x of 6 mm. The etched area 102 extends past the trailing edge of the aperture 101 a length 105 of 0.5 mm. The etched area 102 has a total length 103+105 of 2 mm. The etched area 102 extends past each side of the aperture 101 a width 104 of 0.5 mm.

Figure 1C:
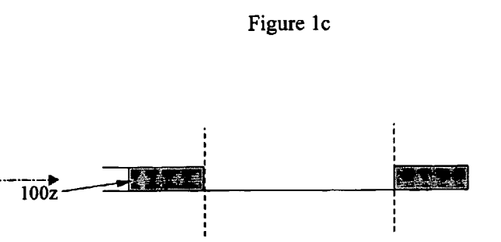
FIG. 1c is a side cross sectional view taken along line A of the portion of the stencil in FIG. 1b.

FIG. 1c shows a side cross sectional view taken along line A of the portion of the stencil 100 with the aperture 101 shown in FIG. 1b. Stencil 100 has a thickness 100z of 5 mil. The etched area 102 may have a thickness 102z of 4, 3, 2, 1.5, or 1 mil.

Figure 1D:
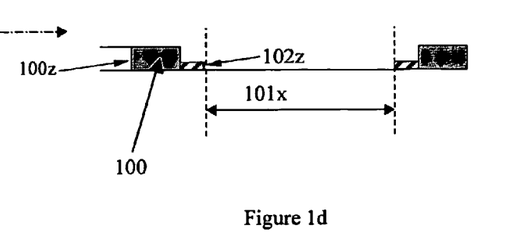
FIG. 1d is a side cross sectional view taken along line B of the portion of the stencil in FIG. 1b.

FIG. 1d shows a side cross sectional view taken along line B of the portion of the stencil 100 with the aperture 101 and etched area 102 in FIG. 1b.

Table 1 shows the height the etched area 102z and the % difference in height of an edgehill at the trailing edge of a pad, which is prepared by printing the composition through the stencil 100 to form a deposit and curing the deposit, as compared to the average height of the remainder of the pad.

Comparative Example 1

Example 1 was repeated except that a stencil having a 6 mm×6 mm aperture with a uniform height of 5 mil around the entire perimeter of the aperture was used instead of the down-step stencil. The results are in Table 1.

TABLE 1

|  | Example | | | | | Comparative Example 1 |
| --- | --- | --- | --- | --- | --- | --- |
|  | 1-1 | 1-2 | 1-3 | 1-4 | 1-5 |  |
| Height of Etched Area, 102z (mil) | 4 | 3 | 2 | 1.5 | 1 | 0 |
| Edgehill Height (%) | 37 | 27 | 19 | 5 | 7 | 40 |

Example 1 shows that reduction of the edgehill at the trailing edge is related to the a depth of the step of the stencil. Printing an array of pads with 6 mm×6 mm squares with a standard stencil results in lips at the trailing edge that are up to 40% taller than the average pad.

Figure 3A:
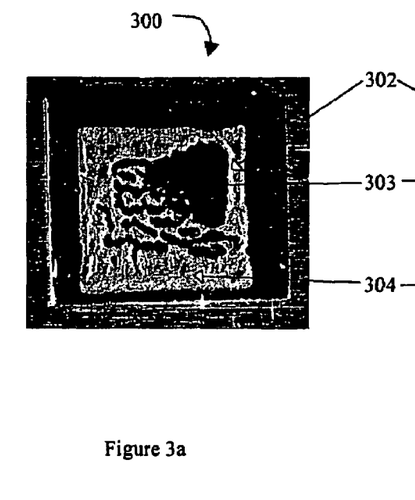
FIG. 3a is a picture of a semiconductor die of Comparative Example 1.
Figure 3B:
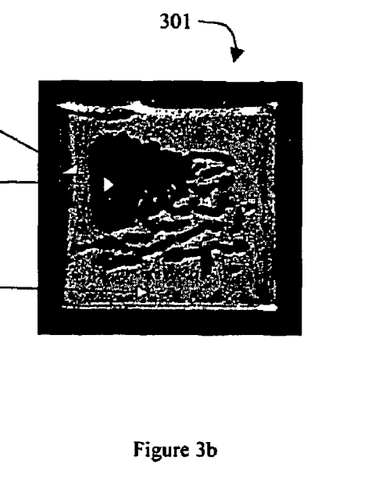
FIG. 3b is a picture of a pad of Comparative Example 1.

A semiconductor die is attached to the surface of the pads formed in Example 1 and Comparative Example 1 by plasma treatment of the pad surface at 100 Watts (W) for 10 seconds (s) in air and room temperature bonding of a silicon die onto the pads. In Comparative Example 1, bonding gives low interfacial contact between surfaces (30 to 40%) and low die shear values even though a relatively long contact time (10 seconds) is applied during the die attach process as shown in FIGS. 3a and 3b. FIG. 3a shows the silicon die 300 of Comparative Example 1 and FIG. 3b shows the pad 301 of Comparative Example 1 after die shear. The edgehill at location 302 causes a noncontact area 303 between the die and the pad, resulting in 60 to 70% cohesive failure 304.

Figure 4A:
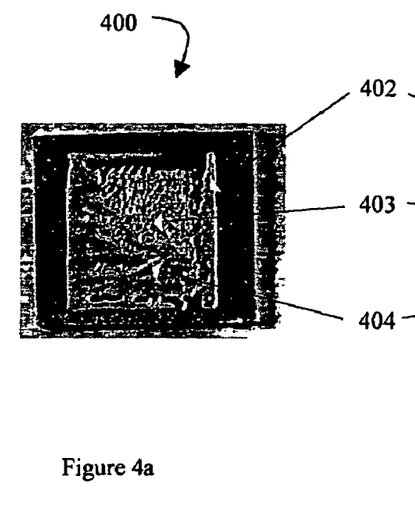
FIG. 4a is a picture of a semiconductor die of Example 1.
Figure 4B:
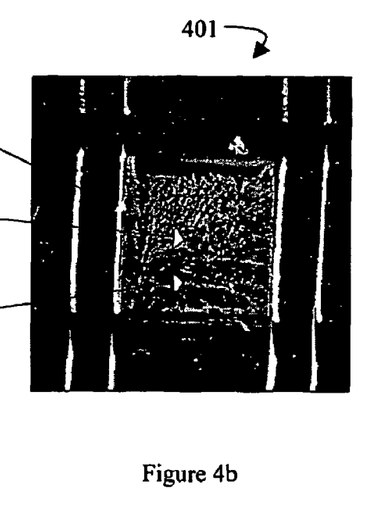
FIG. 4b is a picture of a pad of Example 1.

However, use of a down-step stencil designed so a reduced amount of composition is deposited in the area near the trailing edge during printing by a squeegee motion eliminates the surface unevenness. Plasma treatment of the reduced edgehill surface at 100 W for 10 s in air and room temperature bonding of a silicon die with a relatively short contact time (1 second) leads to high interfacial contact (~100%) and high die shear values as shown in FIG. 4. FIG. 4 shows a silicon die 400 and a printed pad 401 after die shear. The reduction in edgehill at location 402 improves contact area 403 between the die and the pad, resulting in 80 to 90% cohesive failure 404.

INDUSTRIAL APPLICABILITY

Adhesion between a pad and another surface can be improved by removing surface roughness (particularly edgehills on the edge of the pad). The method of this invention may be used, for example, in fabrication of various electronic devices such as MEMS devices and stacked chip modules. The method of this invention may be used various electronic packaging applications such as wafer bonding applications and wafer level packaging applications.

| Reference Numerals | |
|---|---|
| 100 | down-step stencil |
| 100z | thickness of stencil |
| 101 | aperture |
| 101x | width of aperture |
| 101y | length of aperture |
| 102 | etched area |
| 102z | thickness of etched area |
| 103 | length |
| 104 | length |
| 105 | length |
| 200 | stacked chip module |
| 201 | substrate |
| 202 | first IC chip |
| 203 | die attach adhesive |
| 204 | wires |
| 205 | die attach adhesive |
| 206 | second IC chip |
| 207 | wires |
| 208 | solder balls |
| 209 | overmolding |
| 300 | die |
| 301 | pad |
| 302 | edgehill location |
| 303 | noncontact area |
| 304 | cohesive failure area |
| 400 | die |
| 401 | pad |
| 402 | edgehill location |
| 403 | contact area |
| 404 | cohesive failure area |

The invention claimed is:

1. A method comprising:
a) applying a flat-top deposit of a composition onto a first substrate by forcing the composition through a deposition tool having at least one aperture, where the at least one aperture has a perimeter surrounded by sidewalls, where the sidewalls have heights, where the heights are reduced around at least a portion of the perimeter of the apertures on the deposition tool as compared to average height of the deposition tool;
b) hardening the flat-top deposit;
c) adhering a second substrate to the top of the flat-top deposit,
where step c) is performed before, during, or after step b), or combinations thereof; and
d) optionally repeating steps a), b), and c);
where at least one of the first substrate and the second substrate is a semiconductor;
where the deposit is applied by stencil printing using a down-step stencil and down-step stencil includes a plurality of apertures, each aperture has an etched area around its trailing edge, and the etched area has a height less than height of the remainder of the stencil.

2. The method of claim 1, where the composition is selected from the group consisting of a hot-melt adhesive and a curable composition.

3. The method of claim 1, where the composition is a curable composition selected from the group consisting of a curable silicone composition, a curable silicone-organic composition, and a curable organic composition.

4. The method of claim 1, where the composition is a curable silicone composition.

5. The method of claim 1, where the composition comprises:
A) a polyorganosiloxane containing an average of at least two aliphatically unsaturated organic groups per molecule,
B) a polyorganohydrogensiloxane containing an average of at least two silicon bonded hydrogen atoms per molecule, and
C) a hydrosilylation reaction catalyst.

6. The method of claim 5, where the composition further comprises at least one of D) a cure modifier, E) a filler, F) a treating agent for the filler, G) a spacer, H) an adhesion promoter, I) a pigment, J) a rheology modifier, K) a void reducing agent, and L) a solvent.

7. The method of claim 1, where step b) is performed by heating.

8. The method of claim 1, where step c) is performed during or after step b).

9. The method of claim 1, where step c) is performed by a process comprising:
i) activating the top of the flat-top deposit, and
ii) thereafter applying the second substrate to the top of the flat-top deposit.

10. The method of claim 1, where the composition is a die attach adhesive.

11. A method comprising using the method of claim 1, in electronic packaging applications selected from the group consisting of wafer bonding applications and wafer level packaging applications.

* * * * *